(12) United States Patent
Kimura et al.

(10) Patent No.: US 7,365,579 B2
(45) Date of Patent: Apr. 29, 2008

(54) GATE DRIVING CIRCUIT

(75) Inventors: Tomonori Kimura, Obu (JP);
Ryousuke Inoshita, Nishikamo-gun (JP)

(73) Assignee: DENSO CORPORATION, Kariya (JP)

( * ) Notice: Subject to any disclaimer, the term of this patent is extended or adjusted under 35 U.S.C. 154(b) by 328 days.

(21) Appl. No.: 11/300,270

(22) Filed: Dec. 15, 2005

(65) Prior Publication Data
US 2006/0186933 A1    Aug. 24, 2006

(30) Foreign Application Priority Data
Feb. 21, 2005   (JP) .............................. 2005-044273

(51) Int. Cl.
*H03B 1/00*   (2006.01)

(52) U.S. Cl. .................... 327/109; 327/112; 327/424; 327/588

(58) Field of Classification Search ........ 327/108–112, 327/423, 424, 587, 588
See application file for complete search history.

(56) References Cited

U.S. PATENT DOCUMENTS

| | | | | |
|---|---|---|---|---|
| 4,224,535 A | * | 9/1980 | Wilson et al. | 327/109 |
| 5,010,261 A | * | 4/1991 | Steigerwald | 327/404 |
| 5,019,719 A | * | 5/1991 | King | 327/110 |
| 5,089,719 A | * | 2/1992 | Kamei et al. | 327/109 |
| 6,441,673 B1 | * | 8/2002 | Zhang | 327/423 |
| 6,650,169 B2 | * | 11/2003 | Faye et al. | 327/404 |
| 6,911,848 B2 | * | 6/2005 | Vinciarelli | 327/108 |
| 7,091,753 B2 | * | 8/2006 | Inoshita | 327/108 |
| 2005/0001659 A1 | | 1/2005 | Inoshita | |

FOREIGN PATENT DOCUMENTS

JP   A-2001-314075   11/2001

\* cited by examiner

*Primary Examiner*—Kenneth B. Wells
*Assistant Examiner*—William Hernandez
(74) *Attorney, Agent, or Firm*—Posz Law Group, PLC (57) ABSTRACT

A gate driving circuit has a variable current carrying path that switches a current carrying path among a driving target device, a DC power source and a reactor to operate in plural operation modes including at least a hold mode, a preparation mode, and an execution mode. The variable current carrying path includes a backflow path for causing a reactor current flowing through the reactor to flow back to the DC power source when a gate voltage of the driving target device deviates from a preset allowable voltage range. A drive control part sets the operation mode of the variable current carrying path to the hold mode and holds the ON state or the OFF state of the driving target device, and further switches the operation mode in sequence of the preparation mode and the execution mode, and realizes turn-on or turn-off of the driving target device.

10 Claims, 12 Drawing Sheets

OFF STATE HOLD

FIG. 6B

TURN-ON PREPARATION

FIG. 6C

TURN-ON EXECUTION
(Vg RISE)

FIG. 6D

TURN-ON EXECUTION
(Ir FLOW)

FIG. 6E

ON STATE HOLD

FIG. 7A

ON STATE HOLD

FIG. 7B

TURN-OFF PREPARATION

FIG. 7C

TURN-OFF EXECUTION
(Vg FALL)

FIG. 7D

TURN-OFF EXECUTION
(Ir FLOW)

FIG. 7E

OFF STATE HOLD

FIG. 8A

INFLOW CURRENT
GRADUAL INCREASE

FIG. 8B

OUTFLOW CURRENT
GRADUAL INCREASE

FIG. 8C

CURRENT HOLD

FIG. 8D

CURRENT INCREASE

FIG. 8E

CURRENT DECREASE

OFF STATE HOLD

FIG. 10B

TURN-ON PREPARATION

FIG. 10C

TURN-ON EXECUTION
(Vg RISE)

FIG. 10D

TURN-ON EXECUTION
(Ir FLOW)

FIG. 10E

ON STATE HOLD

FIG. 11A

ON STATE HOLD

FIG. 11B

TURN-OFF PREPARATION

FIG. 11C

TURN-OFF EXECUTION
(Vg FALL)

FIG. 11D

TURN-OFF EXECUTION
(Ir FLOW)

FIG. 11E

OFF STATE HOLD

FIG. 12A

INFLOW CURRENT
GRADUAL INCREASE

FIG. 12B

OUTFLOW CURRENT
GRADUAL INCREASE

FIG. 12C

CURRENT HOLD

FIG. 12D

CURRENT INCREASE

FIG. 12E

CURRENT DECREASE

GATE DRIVING CIRCUIT

CROSS REFERENCE TO RELATED APPLICATION

This application is based on and incorporates herein by reference Japanese Patent Application No. 2005-44273 filed on Feb. 21, 2005.

FIELD OF THE INVENTION

The present invention relates to a gate driving circuit for a switching device.

BACKGROUND OF THE INVENTION

A driving circuit for a voltage driving type semiconductor switching device such as an FET or IGBT includes a switching device (ON-driving device) for applying an ON-voltage to the gate of the switching device to be driven (driving target device) and a switching device (OFF-driving device) for applying an OFF-voltage to its gate. The ON/OFF state of the driving target device is controlled by turning on one of the ON-driving device and the OFF-driving device and turning off the other.

In this type of gate driving circuit, it is desired to reduce switching loss and electromagnetic noise, which occur at the time of switching of the driving target device. As one method, the value of a resistor (gate resistor) connected to the gate or the gate current is finely adjusted during a period (switching period) required for turning on or turning off the driving target device (JP 2001-314075A).

The switching operation of the voltage driving type semiconductor switching device can be understood as a charging/discharging process of parasitic capacitance occurring between the gate and emitter (gate and source). Accordingly, when the gate resistor is made small, the current variation rate of a gate current becomes large, and a time required for charging/discharging the parasitic capacitance of the gate becomes short. Accordingly, the switching loss is reduced but the noise is increased. On the other hand, when the gate resistor is made large, although the noise is reduced, the switching loss is increased.

By using this relation, driving is performed such that the gate resistor is first set to a low resistance value, so that the voltage between the collector and emitter quickly rises, that is, high-speed switching is made. Then, when the voltage between the collector and emitter reaches a specified value, the gate resistor is switched to a high resistance value, so that the variation rate of the voltage or current is suppressed.

However, the switching period of the voltage driving type semiconductor switching device used as the driving target device is normally several hundreds nanoseconds (ns) or less. In the above conventional gate driving circuit of JP 2001-314075A, the resistance value must be switched at good timing in such a very short switching period.

Accordingly, the conventional device must be constructed by using a high speed operating element to make the gate resistance value variable, and a high accuracy sensor to detect a high voltage. Thus, the device becomes complicated and expensive. Further, the control is difficult since there is no margin in the timing of the control. Besides, since the conventional device uses the gate resistor, it is impossible to avoid the trade-off between the noise reduction and the switching loss reduction (high-speed switching). Still further, a great improvement cannot be expected, and a conduction loss at the gate resistor is increased when the frequency of switching of the driving target device is further increased.

Figure 13:
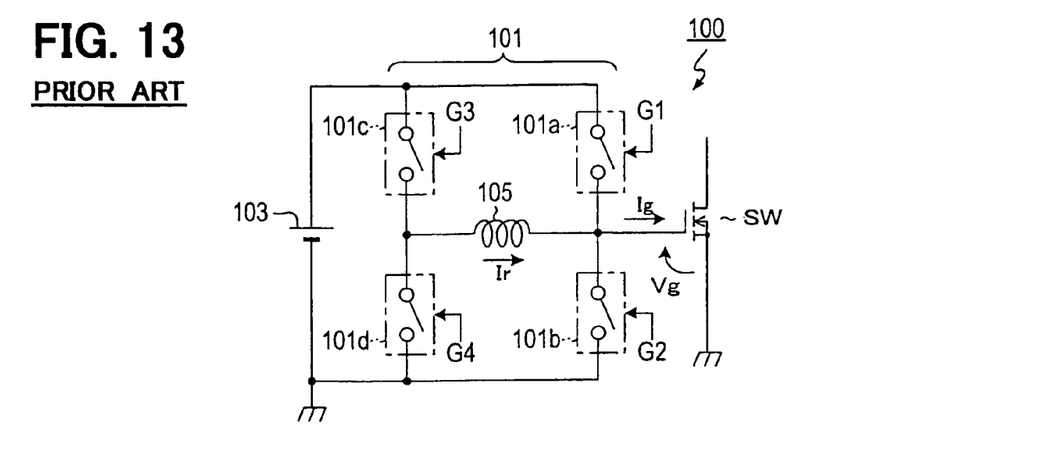
FIG. 13 is a circuit diagram of a conventional gate driving circuit.

On the other hand, US 2005/0001659A1 (JP 2005-39988A) proposes a gate driving circuit 100 constructed as shown in FIG. 13. In this circuit 100, power is supplied from a DC power source 103 to a reactor 105 through a bridge circuit 101 including four switching devices 101a to 101d, and one end of the reactor 105 is connected to a gate of a driving target device SW.

Figure 14:
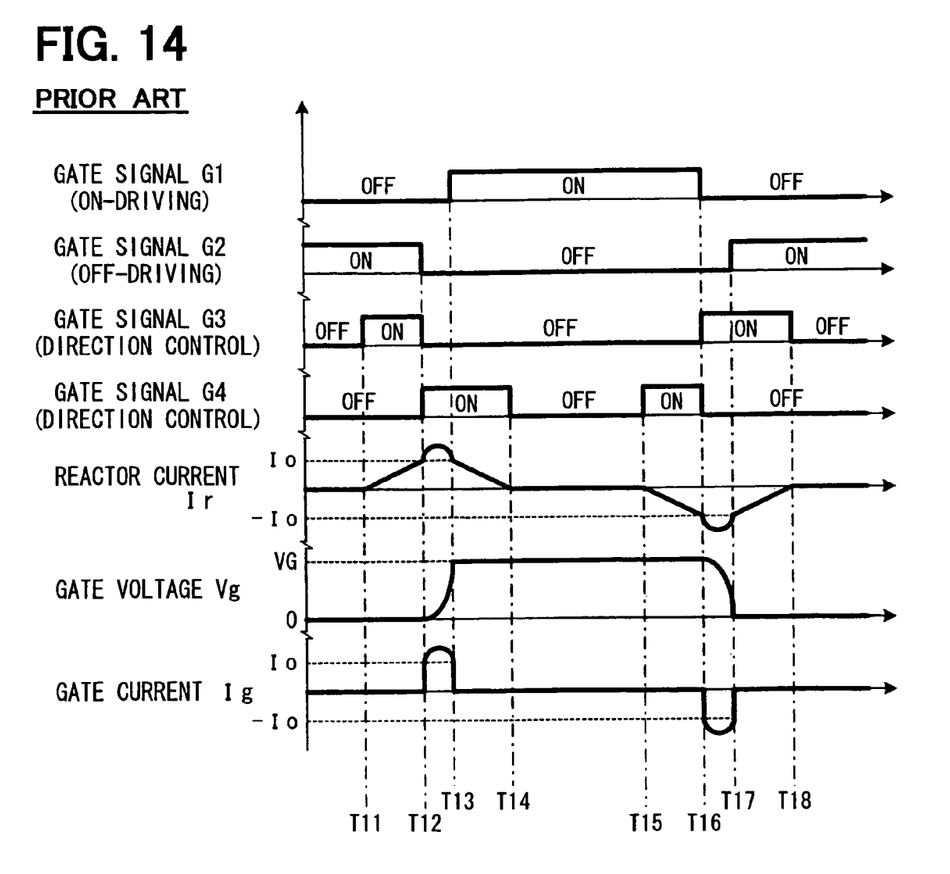
FIG. 14 is a timing chart showing operations of respective parts of the conventional gate driving circuit.

In this gate driving circuit 100, as shown in FIG. 14, when the driving target device SW is turned on (switching from the OFF state to the ON state) or turned off (switching from the ON state to the OFF state), a reactor current Ir is made to flow through the reactor 105 via the bridge circuit 101 during a set specific period (T11 to T12, T15 to T16). When the reactor current Ir increases to a necessary magnitude (timing T12, T16), the connection state of the bridge circuit 101 is switched so that the reactor 105 and parasitic capacitance of the gate of the driving target device SW form a resonant circuit. Thus, the gate current Ig is not gradually increased after turn-on or turn-off, but the gate current Ig equal to the reactor current Ir flows at the same time as the turn-on or turn-off. Further, the gate current Ig flowing through the resonant circuit does not quickly change, and accordingly, the reduction (high-speed switching) of the switching loss and the reduction of noise can be made compatible with each other.

However, in this gate driving circuit 100, when the interval between the turn-on and the turn-off (interval between T12 and T16) becomes short, the reactor current Ir with a required magnitude cannot be made to flow before the next turn-on or turn-off, and the foregoing effect cannot be sufficiently obtained.

That is, in the gate driving circuit 100, the direction of the reactor current Ir flowing through the reactor 105 is opposite between the turn-on time and the turn-off time. Therefore, when the reactor current Ir for the next turn-on or turn-off is started to flow (when the timings T14 and T15 are reversed) before the reactor current Ir is returned to zero, the reactor current Ir cannot be increased to the required magnitude before the timing T12 or T16 of the turn-on or turn-off.

SUMMARY OF THE INVENTION

The invention has an object to provide a gate driving circuit which reduces both switching loss and noise, and simplifies control even if an interval between a turn-on and a turn-off is short.

In a gate driving circuit, a DC power source, a reactor, and a driving target device are connected to one another through a variable current carrying path capable of switching a current carrying path among them, and this variable current carrying path operates in at least the following operation modes in accordance with instructions from a drive control part.

In a hold mode, a gate of the driving target device is directly connected to a positive electrode or a negative electrode of the DC power source, and the driving target device is held in the ON state or the OFF state.

In a preparation mode, the ON state or the OFF state of the driving target device held in the hold mode is held, and a closed loop to cause a current to flow through the reactor from the positive electrode side terminal to the negative electrode side terminal is formed between the DC power source and the reactor.

In an execution mode, a closed loop (resonant circuit) to cause a gate current equal to the reactor current to flow in or out is formed between the reactor and parasitic capacitance of the gate of the driving target device.

Besides, the variable current carrying path includes a backflow path to cause the reactor current to flow back to the DC power source when the gate voltage of the driving target device deviates from a set allowable voltage range during the operation in the execution mode.

The drive control part sets the operation mode of the variable current carrying path to the hold mode to hold the ON state or the OFF state of the driving target device, and switches the mode in sequence of the preparation mode and the execution mode to realize the turn-on or turn-off of the driving target device.

In the gate driving circuit, the reactor current is made to flow through the reactor in the preparation mode before the turn-on or turn-off is performed, so that in the subsequent execution mode, the gate current equal to the reactor current flows from immediately after the start thereof, that is, from immediately after the turn-on or turn-off is performed. Further, the gate current flows through the resonant circuit, and therefore the magnitude of the current is not quickly changed. Accordingly, the reduction of switching loss (high-speed switching) of the driving target device and the reduction of noise can be made compatible with each other.

Besides, the reactor currents flowing through the reactor when the driving target device is turned on and turned off have the same direction. Therefore, even in the case where the next turn-off or turn-on operation is started (reactor current starts to flow) before the former turn-on or turn-off operation is ended (before the reactor current is returned to zero), the reactor current does not become insufficient at the time of execution of the turn-on or turn-off (at the time of start of the execution mode), and the initial value of the gate current flowing at the time of the turn-on or turn-off can be made a desired magnitude without fail.

Besides, since it is unnecessary to perform a fine control during the switching period (corresponding to the execution mode) of the driving target device, the control can be easily performed.

Further, since the variable current carrying path includes the backflow path, a gate voltage larger than necessary is not applied to the gate of the driving target device, and the durability and reliability of the driving target device can be improved.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE EMBODIMENT

First Embodiment

Figure 1:
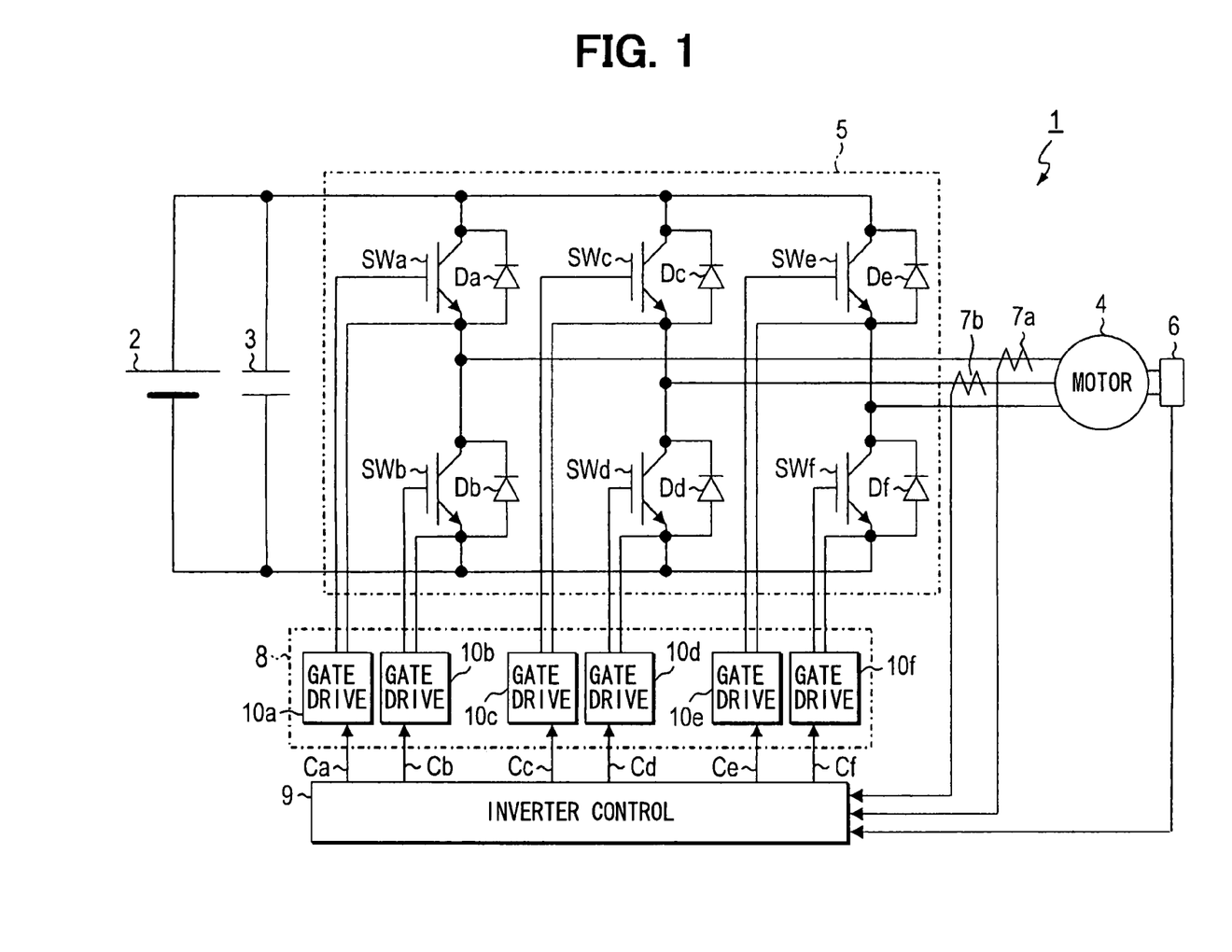
FIG. 1 is a circuit diagram an inverter apparatus.

Referring first to FIG. 1, an inverter apparatus 1 includes a chargeable/dischargeable DC power source 2, a capacitor 3 connected in parallel to the DC power source 2 for smoothing a main current flowing through a power source line, an electric motor 4 as a load, and a three-phase bridge circuit 5 for receiving electric power from the DC power source 2 through the power source line and supplying currents to windings of respective phases U, V and W of the motor 4.

The three-phase bridge circuit 5 includes six switching devices SWa to SWf (collectively SW), and has a well-known structure in which three pairs, each including a pair of series-connected switching devices SW, are connected in parallel between the positive electrode and negative electrode of the DC power source 2. Connection portions of the switching devices SW of the respective pairs are connected to the windings of the respective phases U, V and W of the motor 4. An insulated gate bipolar transistor (IGBT) is used as the switching device SW, and flywheel diodes Da to Df (collectively D) are connected in a reverse-biased direction (i.e., anti-parallel) to the respective switching devices SW.

The power is received from the DC power source 2, the switching devices SW are suitably controlled to turn on/off, and the currents to the windings of the motor 4 are controlled. Thus, the rotation state of the motor 4, and the rotation position at the time of a stop are controlled. When a rotor of the motor 4 is rotated by an external force, an AC current supplied from the motor 4 is rectified and smoothed through the flywheel diodes D and the capacitor 3 and is supplied to the DC power source 2, so that the DC power source 2 can be charged.

Besides, the inverter apparatus 1 includes a position detector 6 to detect the rotation position of the rotor of the motor 4, current detectors 7a, 7b (collectively 7) to detect the magnitudes of the currents flowing through the U and V phases of the motor 4, a driver part 8 including six gate driving circuits 10a to 10f (collectively 10) provided for the respective switching devices SW for driving the respective switching devices SW, and an inverter control part 9 which sets gate commands Ca to Cf (collectively C) to specify timings and periods for switching the respective switching devices SW, initial gate current values Ion and Ioff, and execution mode continuation times t2 and t4 in accordance with detection results in the position detector 6 and the current detectors 7, and supplies them to the respective gate driving circuits 10.

Figure 2A:
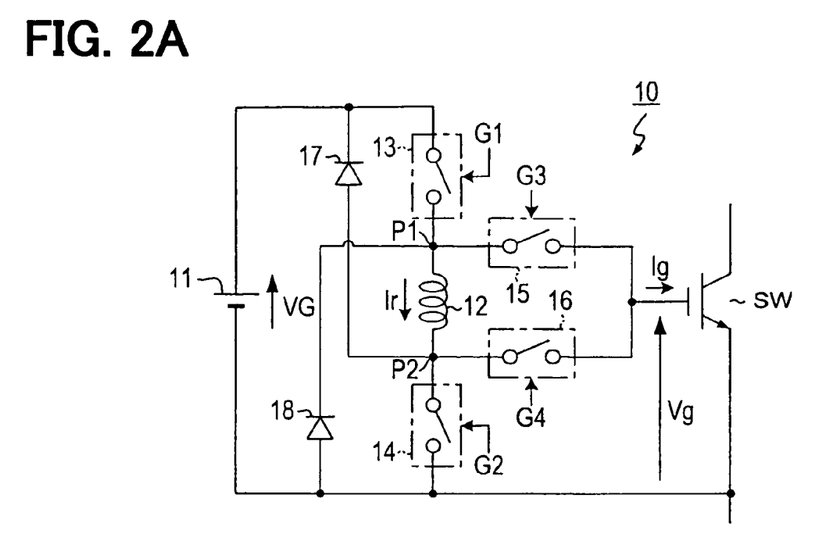
FIGS. 2A and 2B are circuit diagrams of a gate driving circuit, and a gate control part and a detection part in a first embodiment of the present invention, respectively.

All the gate driving circuits 10 have the same structure. The gate commands C are also similar. Each gate driving circuit 10 is constructed as shown in FIG. 2A.

The gate driving circuit 10 includes a DC power source 11 whose negative electrode side is connected to the emitter of a switching device (driving target device) SW, a reactor 12 having an inductance of a set magnitude. It also includes a first switch 13 for interrupting a current carrying path from one end (positive electrode side terminal) P1 of the reactor 12 to the positive electrode of the DC power source 11 in accordance with a gate signal G1, a second switch 14 for interrupting a current carrying path from the other end (negative electrode side terminal) P2 of the reactor 12 to the negative electrode of the DC power source 11 in accordance with a gate signal G2, a third switch 15 for interrupting a current carrying path from the positive electrode side terminal P1 of the reactor 12 to the gate of the driving target device SW in accordance with a gate signal G3, a fourth switch 16 for interrupting a current carrying path from the negative electrode side terminal P2 of the reactor 12 to the gate of the driving target device SW in accordance with a gate signal G4. Further it includes a first diode 17 whose anode is connected to the negative electrode side terminal P2 of the reactor 12 and whose cathode is connected to the positive electrode of the DC power source 11, and a second diode 18 whose cathode is connected to the positive electrode side terminal P1 of the reactor 12 and whose anode is connected to the negative electrode of the DC power source 11.

Figure 2B:
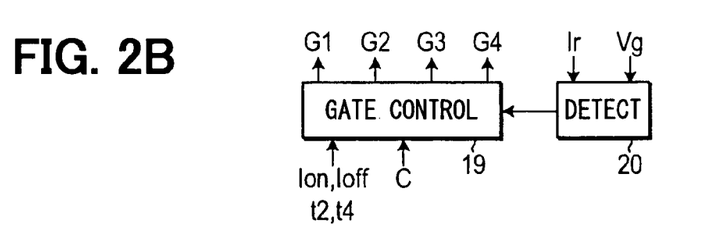

Further, as shown in FIG. 2B, the gate driving circuit 10 includes a detection part 20 for detecting a gate/emitter voltage (gate voltage) Vg of the driving target device SW and a current (reactor current) Ir flowing through the reactor 12, and a gate control part 19 for generating the gate signals G1 to G4 to drive the first to the fourth switches 13 to 16 based on the gate command C supplied from the inverter control part 9, the initial gate currents Ion and Ioff, the execution mode continuation times t2 and t4, and the detection result in the detection part 20.

The detection in the detection part 20 may be performed by a well-known method, and the gate voltage Vg may be detected by, for example, measuring a divided voltage divided by a voltage dividing circuit connected between the gate and emitter of the driving target device SW and including series resistors. Besides, the reactor current Ir may be detected by, for example, measuring magnetic field generated from the reactor 12 when the reactor current Ir flows, or may be detected in such a way that a shunt resistor is inserted in the circuit, and its voltage drop is measured.

Besides, the driving target device SW is turned off without fail when the gate voltage Vg is 0 V, and the voltage VG of the DC power source 11 is set to produce the gate/emitter voltage Vg not lower than a voltage necessary to turn on the driving target device SW without fail.

Figure 3A:
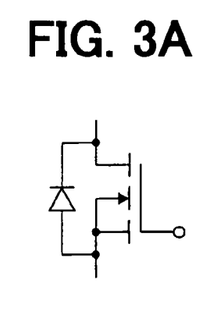
FIGS. 3A to 3C are circuit diagrams of switches.
Figure 3B:
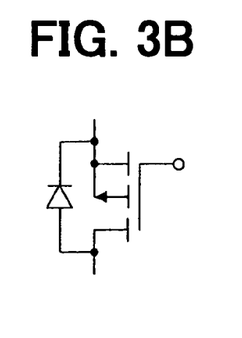
Figure 3C:
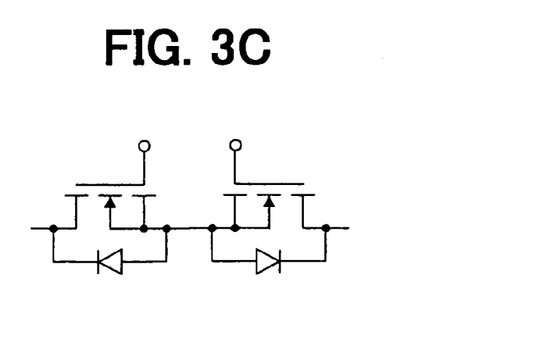

Each of the first and the second switches 13 and 14 includes a P-channel MOSFET having a reverse-biased diode as shown in FIG. 3A or an N-channel MOSFET having a reverse-biased diode as shown in FIG. 3B. On the other hand, each of the third and the fourth switches 15 and 16 includes a bidirectional switch in which a pair of N-channel MOSFETs having reverse-biased diodes are connected in series to each other (that is, sources are connected) so that the antiparallel diodes are directed in the opposite directions to each other.

Figure 6A:
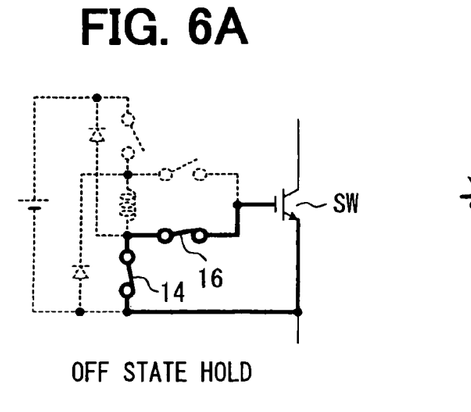
FIGS. 6A to 6E are operation diagrams showing operation modes at the time of a turn-on of the gate driving circuit in the first embodiment.
Figure 6E:
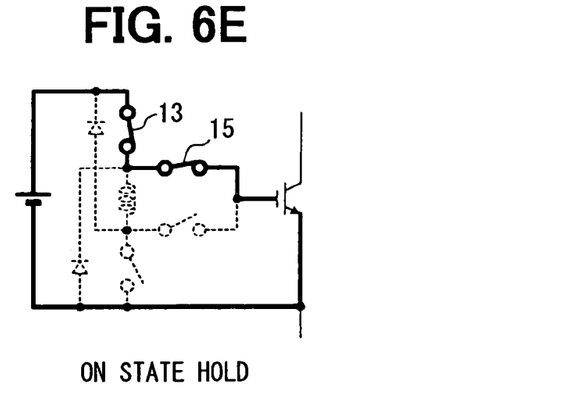
Figure 7A:
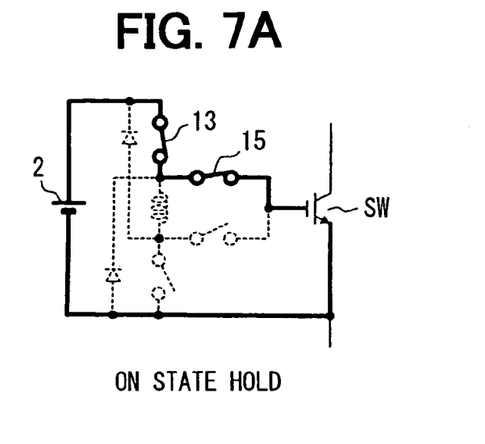
FIGS. 7A to 7E are operation diagrams showing operation modes at the time of a turn-off operation of the gate driving circuit in the first embodiment.
Figure 7B:
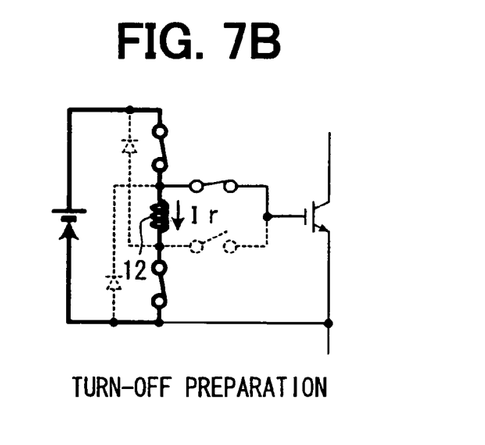
Figure 7C:
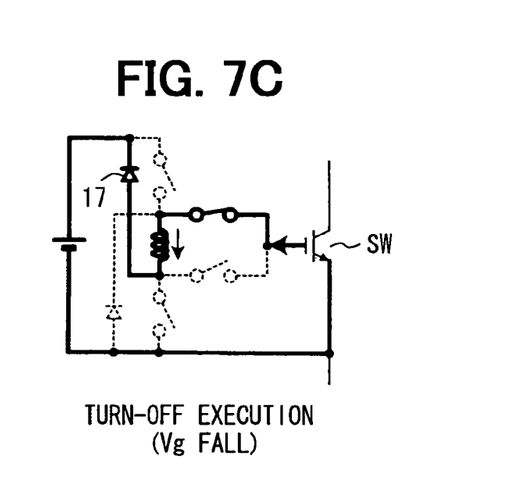
Figure 7D:
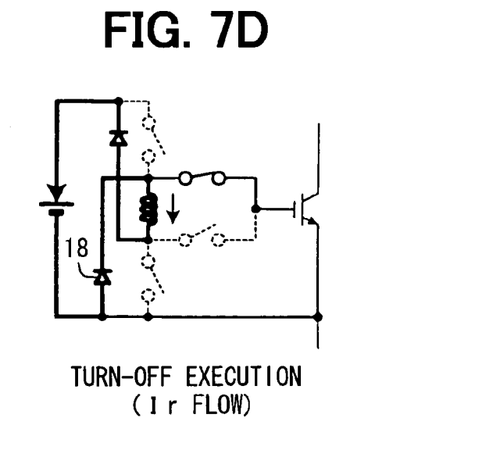
Figure 7E:
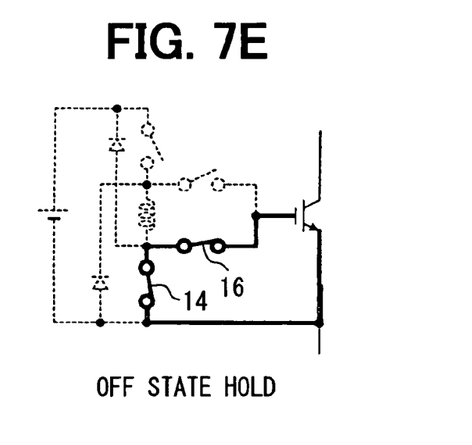

In the following, an operation mode in which the first and the third switches 13 and 15 are turned off and the second and the fourth switches 14 and 16 are turned on as shown in FIGS. 6A and 7E is defined as an OFF state hold mode. An operation mode in which the first and the third switches 13 and 15 are turned on and the second and the fourth switches 14 and 16 are turned off as shown in FIGS. 6E and 7A is defined as an ON state hold mode.

Figure 6B:
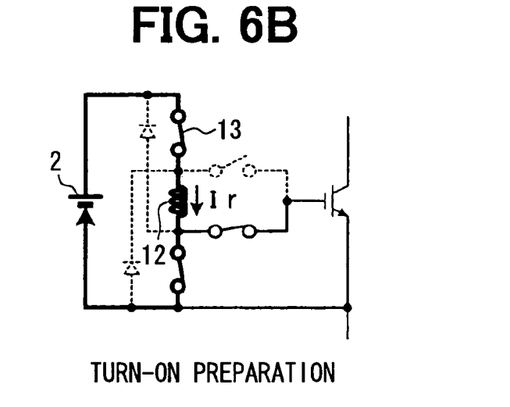

Besides, an operation mode in which only the third switch 15 is turned off and the other switches 13, 14 and 16 are turned on as shown in FIG. 6B is defined as a turn-on preparation mode. An operation mode in which only the fourth switch 16 is turned off and the other switches 13, 14 and 15 are turned on as shown in FIG. 7B is defined as a turn-off preparation mode.

Figure 6C:
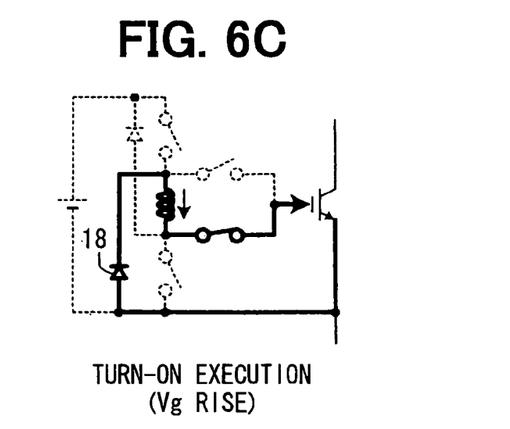
Figure 6D:
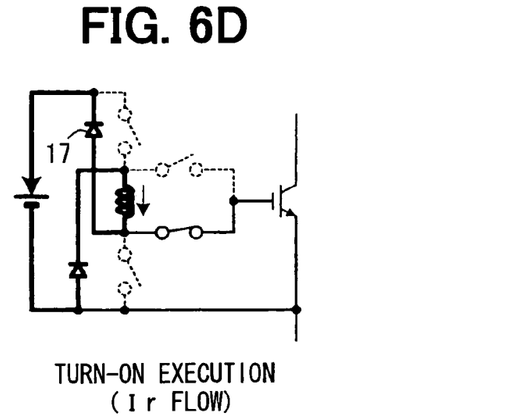

Further, an operation mode in which only the fourth switch 16 is turned on and the other switches 13, 14 and 15 are turned off as shown in FIGS. 6C and 6D is defined as a turn-on execution mode. An operation mode in which only the third switch 15 is turned on and the other switches 13, 14 and 16 are turned off as shown in FIGS. 7C and 7D are defined as a turn-off execution mode.

The gate control part 19 is mainly constructed of a well-known microcomputer made of a CPU, a ROM, a RAM and the like, and includes at least a timer for determining various timings.

Here, switching control processing executed in the CPU of the gate control part 19 will be described with reference to a flowchart shown in FIG. 4, a timing chart shown in FIG. 5A, and operation modes shown in FIGS. 6A to 7E.

The inverter control part 9 sets the initial gate currents Ion and Ioff, and the execution mode continuation times t2 and t4 in accordance with the magnitude of the load specified from the detection result in the current detector 7. The gate command C generated in the inverter control part 9 is set to be switched from OFF to ON faster than a timing when the turn-on is actually to be performed by a time necessary for the gate driving circuit 10 to cause the initial gate current Ion to flow, that is, a preparation mode continuation time t1, and is set to be switched from ON to OFF faster than a timing when turn-off is actually to be performed by a time necessary for the gate driving circuit 10 to cause the initial gate current Ioff to flow, that is, a preparation mode continuation time t3.

The execution mode continuation time t2, t4 is set to be not shorter than a length obtained by adding a time required for the reactor current Ir to change from the initial gate current Ion, Ioff to 0 to a time required for the gate voltage Vg to change from an OFF-voltage (0V) to an ON-voltage (VG) or from the ON-voltage to the OFF-voltage. Here, such a fixed value as to satisfy the condition when the load is lowest is used.

Figure 4:
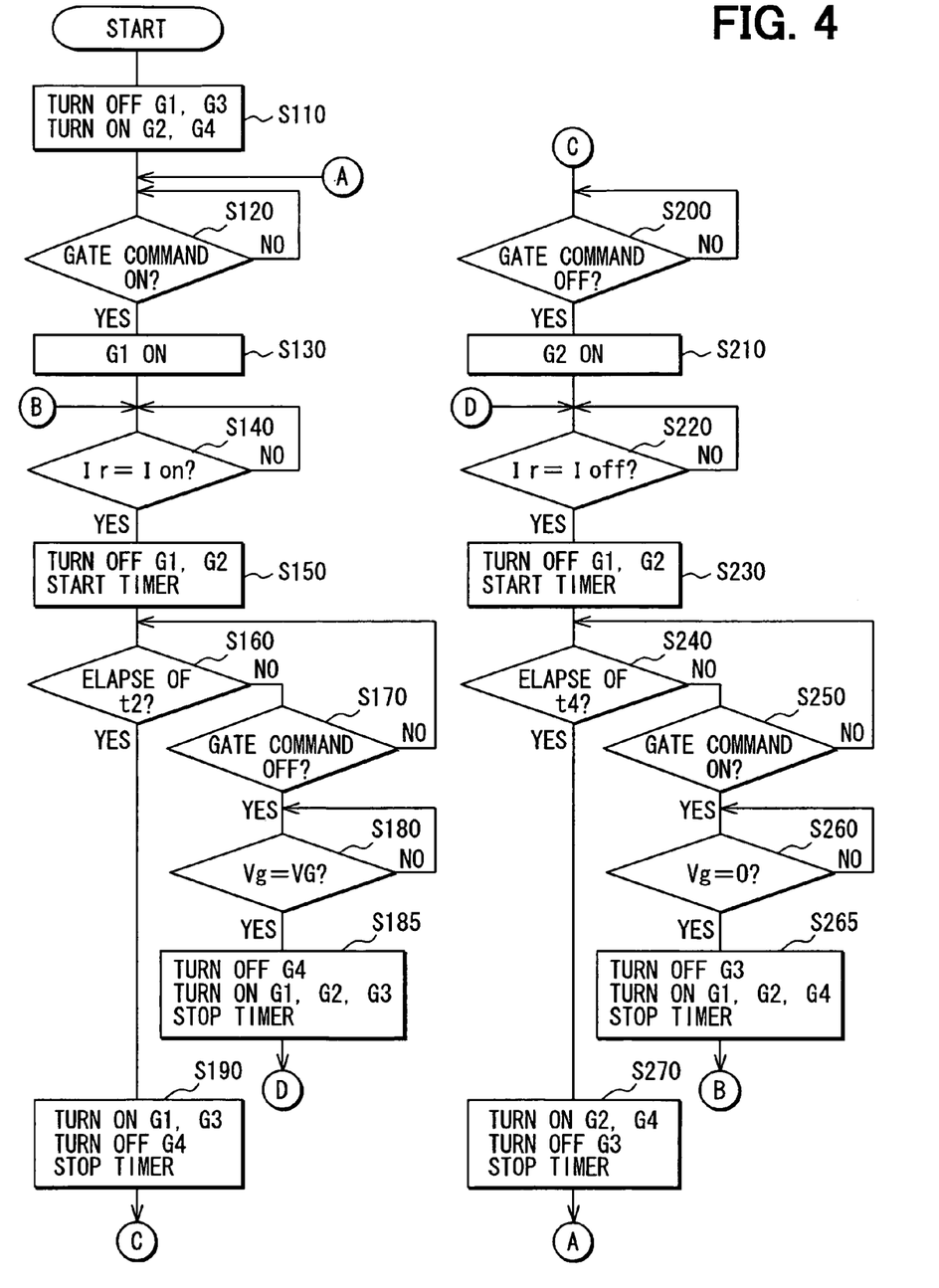
FIG. 4 is a flowchart showing a switching control processing executed in the first embodiment.
Figure 5A:
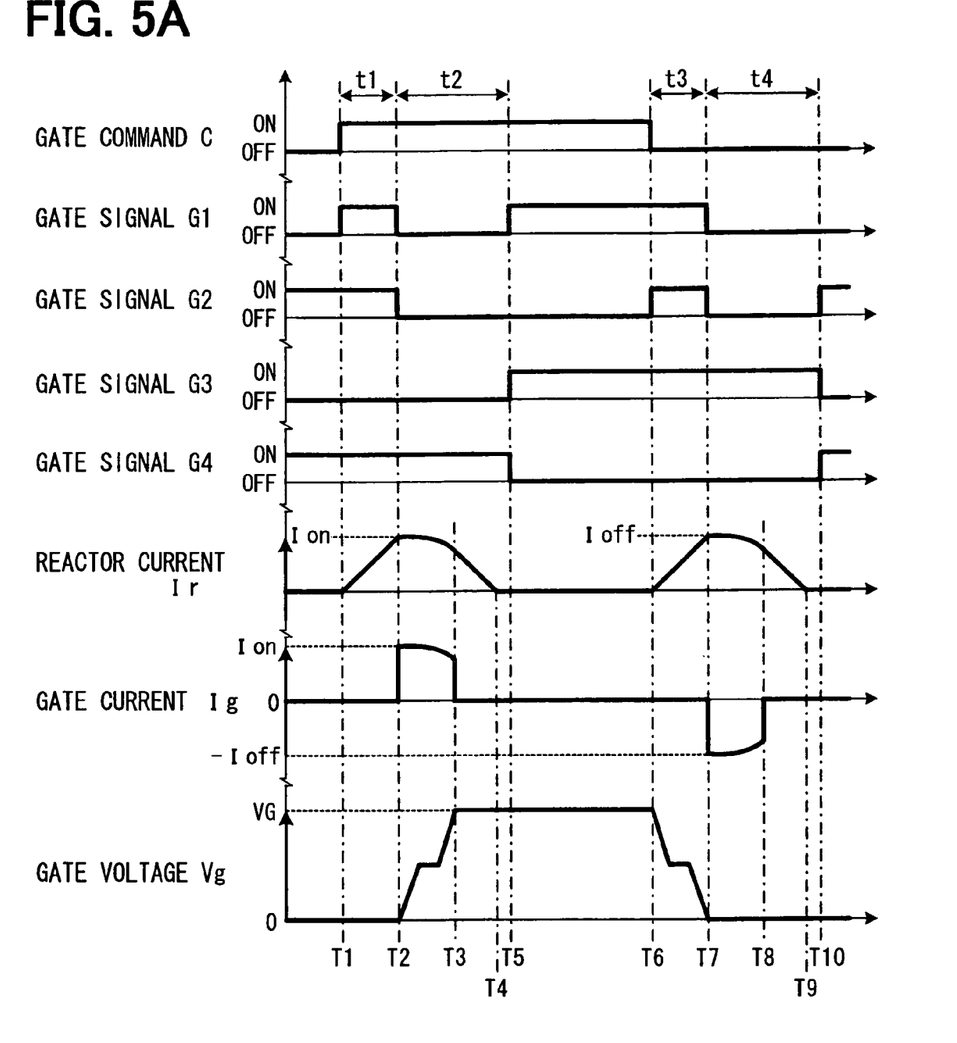
FIGS. 5A and 5B are timing charts showing operations of respective parts of the gate driving circuits in the first embodiment.

As shown in FIG. 4, when the switching control processing is started, first, the gate signals G1 and G3 are turned off (rendered low) and the gate signals G2 and G4 are turned on (rendered high). Thus, the operation mode is initialized to the OFF state hold mode (S110).

At this time, as shown in FIG. 6A, there occurs a state in which the OFF-voltage is applied to the gate of the driving target device SW through the second and the fourth switches 14 and 16.

Standby continues until the gate command C from the inverter control part 9 is turned on (S120). When the gate command is turned on (timing T1 in FIG. 5A, and so forth), the gate signal G1 is turned on, so that the operation mode is switched to the turn-on preparation mode (S130).

Then, as shown in FIG. 6B, while the state is held in which the OFF-voltage is applied to the gate of the driving target device SW through the second and the fourth switches 14 and 16, a closed circuit of the DC power source 11, the reactor 12, and the first and the second switches 13 and 14 is formed. Thus, the reactor current Ir flows through the reactor 12 from the positive electrode side terminal P1 to the negative electrode side terminal P2, and its magnitude is linearly increased with the lapse of time.

Thereafter, the detection result in the detection part 20 is monitored, and standby continues until the reactor current Ir reaches the initial gate current Ion (S140).

When the reactor current Ir reaches the initial gate current Ion (timing T2), the gate signals G1 and G2 are simultaneously turned off, so that the operation mode is switched to the turn-on execution mode, and a timer for timing is started (S150).

Then, as shown in FIG. 6C, a closed circuit (resonant circuit) of the second diode 18, the reactor 12, the fourth switch 16, and the parasitic capacitance (gate capacitance) of the gate of the driving target device SW is formed. By the resonant phenomenon of the resonant circuit, the reactor current Ir (=Ion) flowing at the time of switching (timing T2) to the turn-on execution mode is made the initial value, and the gate current Ig (=reactor current Ir) flows into the gate of the driving target device SW, so that the gate capacitance is rapidly charged, and the gate voltage Vg is also increased with this.

When the gate voltage Vg reaches the ON-voltage VG (timing T3), as shown in FIG. 6D, the first diode 17 is turned on so that the gate voltage Vg is clamped to the ON-voltage VG, and further, a backflow path to the DC power source 11 is formed, and the reactor current Ir flows back to the DC power source 11. At this time, the reactor current Ir is linearly decreased with the lapse of time.

During this, by monitoring the timer for timing, it is determined whether the elapsed time measured by the timer for timing reaches the execution mode continuation time t2 (S160), and whether the gate command C is turned off (S170). In the case where both the determinations are negative, return is made to S160, and the standby continues by repeatedly performing S160 and S170.

In the case where it is determined at S160 that the elapsed time reaches the execution mode continuation time t2 (timing T5), it is assumed that the reactor current Ir does not flow any more, and the gate signals G1 and G3 are turned on, and the gate signal G4 is turned off, so that the operation mode is switched to the ON state hold mode, and further, the timer for timing is stopped (S190), and a transition is made to S200.

Then, as shown in FIGS. 6E and 7A, there occurs a state in which the ON-voltage is applied to the gate of the driving target device SW through the first and the third switches 13 and 15.

On the other hand, in the case where it is determined at S170 that the gate command C is off before the elapsed time measured by the timer for timing reaches the execution mode continuation time t2 (in the case where the timings T4 and T5 are reversed), based on the detection result in the detection part 20, it is determined whether the gate voltage Vg reaches the ON-voltage VG, that is, whether the backflow of the reactor current Ir has started (S180).

When the gate voltage Vg does not reach the ON-voltage VG, the standby continues by repeating the step, and when the gate voltage Vg reaches the ON-voltage VG, the gate signal G4 is turned off, and the gate signals G1, G2 and G3 are turned on, so that the operation mode is immediately switched to the turn-off preparation mode not via the ON state hold mode, and further, the timer for timing is stopped (S185), and a transition is made to S220.

Hereinafter, at S200 to S270, processing similar to S120 to S190 is performed in which the replacement of gate command ON→gate command OFF, gate command OFF→gate command ON, t2→t4, G1→G2, G2→G1, G3→G4, and G4→G3 is carried out.

That is, the standby continues until the gate command C from the inverter control part 9 is turned off (S220), and when the gate command C is turned off (timing T6), the gate signal G2 is turned on, so that the operation mode is switched to the turn-off preparation mode (S210).

As shown in FIG. 7B, while the state is held in which the ON-voltage is applied to the gate of the driving target device SW through the first and the third switches 13 and 15, a closed circuit of the DC power source 11, the reactor 12, and the first and the second switches 13 and 14 is formed. By this, the reactor current Ir flows through the reactor 12 from the positive electrode side terminal P1 to the negative electrode side terminal P2, and its magnitude is linearly increased with the lapse of time.

Thereafter, the detection result in the detection part 20 is monitored, and the standby continues until the reactor current Ir reaches the initial gate current Ioff (S220).

When the reactor current Ir reaches the initial gate current Ioff (timing T7), the gate signals G1 and G2 are turned off at the same time, so that the operation mode is switched to the turn-off execution mode, and the timer for timing is started (S230).

Then, as shown in FIG. 7C, a closed circuit (resonant circuit) of the first diode 17, the reactor 12, the third switch 15 and the gate capacitance of the driving target device SW is formed. By the resonant phenomenon of the resonant circuit, the reactor current Ir (=Ioff) flowing at the time of switching (timing T7) to the turn-off execution mode is made the initial value, and the gate current Ig (=reactor current Ir) flows out from the gate of the driving target device SW, so that the gate capacitance is quickly discharged, and the gate voltage Vg is also lowered with this.

When the gate voltage Vg reaches the OFF-voltage (0 V) at timing T8, as shown in FIG. 7D, the second diode 18 is turned on, so that the gate voltage Vg is clamped to the OFF-voltage. Further, a backflow path to the DC power source is formed, and the reactor current Ir flows back to the DC power source 11. At this time, the reactor current Ir is linearly decreased with the lapse of time.

During this, by monitoring the timer for timing, it is determined whether the elapsed time measured by the timer for timing reaches the execution mode continuation time t4 (S240), and whether the gate command C is ON (S250), and in the case where both the determinations are negative, return is made to S240, and the standby continues by repeatedly performing S240 and S250.

In the case where it is determined at S240 that the elapsed time reaches the execution mode continuation time t4 (timing T10), it is assumed that the reactor current Ir does not already flow, and the gate signals G2 and G4 are turned on, and the gate signal G3 is turned off, so that the operation mode is switched to the OFF state hold mode, and further, the timer for timing is stopped (S270), and return is made to S120.

As shown in FIGS. 7E and 6A, return is made to the state in which the OFF-voltage is applied to the gate of the driving target device SW through the second and the fourth switches 14 and 16, that is, the same state as that at the time when S110 is performed.

On the other hand, in the case where it is determined at S250 that the gate command C is on before the elapsed time measured by the timer for timing reaches the execution mode continuation time t4 (in the case where timings T9 and T10 are reversed), based on the detection result in the detection part 20, it is determined whether the gate voltage Vg reaches the OFF-voltage (0 V), that is, backflow of the reactor current Ir has started (S260).

When the gate voltage Vg does not reach the OFF-voltage (0 V), the standby continues by repeating the step. When the gate voltage Vg reaches the ON-voltage VG, the gate signal G3 is turned off, and the gate signals G1, G2 and G4 are turned on, so that the operation mode is immediately switched to the turn-on preparation mode not via the OFF state hold mode, and further, the timer for timing is stopped (S265), and a transition is made to S140.

As described above, according to this embodiment, in the gate driving circuit 10, the reactor current Ir is made to flow from the positive electrode side terminal P1 to the negative electrode side terminal P2 of the reactor 12 before the execution of turn-on or turn-off of the driving target device SW. Thereafter, at the time of the execution of the turn-on or turn-off, the closed loop (resonant circuit) including the reactor 12 and the gate capacitance is formed. Immediately after the execution, the gate current Ig equal to the reactor current Ir is made to flow.

Thus, according to the gate driving circuit 10, the gate capacitance can be quickly charged/discharged. Further, since the magnitude of the gate current Ig flowing through the resonant circuit does not quickly change, the reduction of switching loss (high-speed switching) of the driving target device SW and the reduction of noise can be made compatible.

Besides, in the gate driving circuit 10, the reactor currents Ir made to flow through the reactor 12 at the times when the driving target device SW is turned on and turned off are made to have the same direction. Accordingly, even if a new turn-off or turn-on operation is started (reactor current Ir starts to flow) before the reactor current Ir made to flow for the former turn-on or turn-off operation is returned to zero, the gate current Ig of a required magnitude can be ensured without fail at the time of start of the turn-on execution mode or turn-off execution mode.

Besides, in the gate driving circuit 10, at the turn-on execution mode and the turn-off execution mode, the gate voltage of the driving target device SW is clamped to the ON-voltage or the OFF-voltage, and the gate voltage larger than necessary is not applied, so that the durability and reliability of the driving target device SW can be improved.

Besides, in the inverter apparatus 1, the magnitude of the load is obtained from the flowing current of the motor winding detected by the current detector 7, the magnitude of the initial gate current Ion, Ioff, that is, the initial value of the gate current flowing when the mode is switched to the execution mode is set in accordance with the magnitude of the load, and especially when a state is such that the load is large and a surge is liable to occur at the time of switching of the driving target device SW, the initial value of the gate current is made small. Accordingly, when the load is large, the occurrence of the surge in the driving target device SW can be suppressed. On the other hand, when the load is small, the high-speed switching of the driving target device SW is realized, and the consumed electric power during the switching period can be suppressed to the requisite minimum.

In this embodiment, the first to the fourth switches 13, 14, 15 and 16 and the first and the second diodes 17 and 18 form a variable current carrying path, the gate control part 19 and the inverter control part 9 form a drive control part, and the current detector 7 operates as a load detection unit.

Besides, in this embodiment, although the gate driving circuit 10 is made to operate in the OFF state hold mode, the ON state hold mode, the turn-on preparation mode, the turn-off preparation mode, the turn-on execution mode, and the turn-off execution mode, it may be made to operate in operation modes other than these.

Figure 8A:
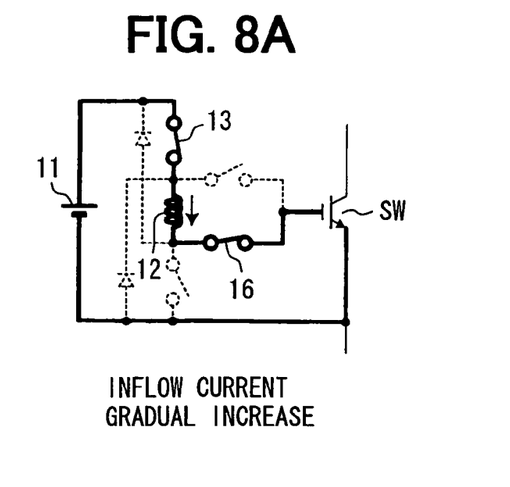
FIGS. 8A to 8E are operation diagrams showing other operation modes of the gate driving circuit in the first embodiment.
Figure 8B:
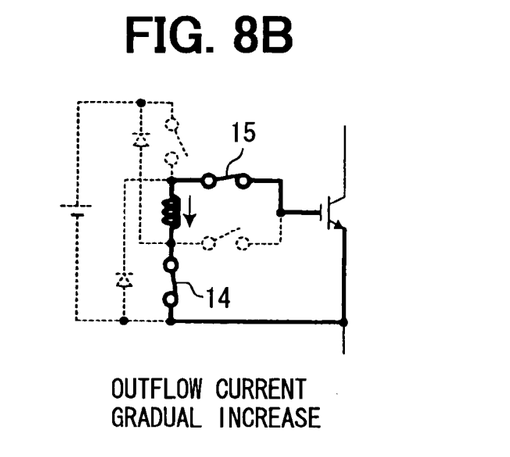
Figure 8C:
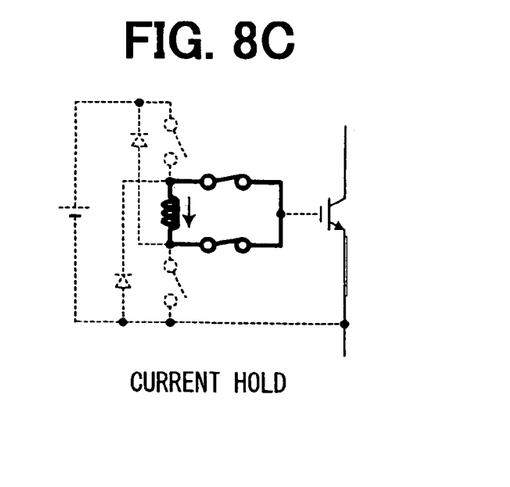
Figure 8D:
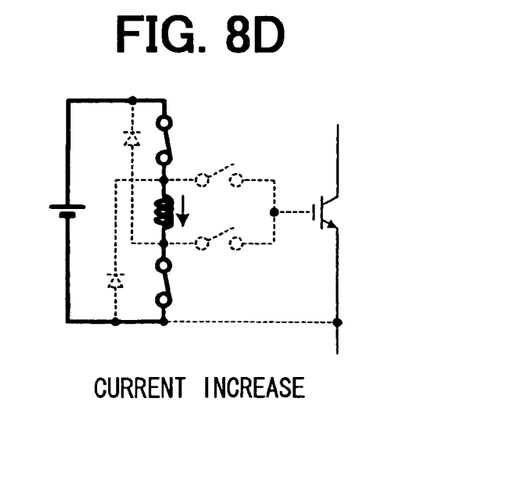
Figure 8E:
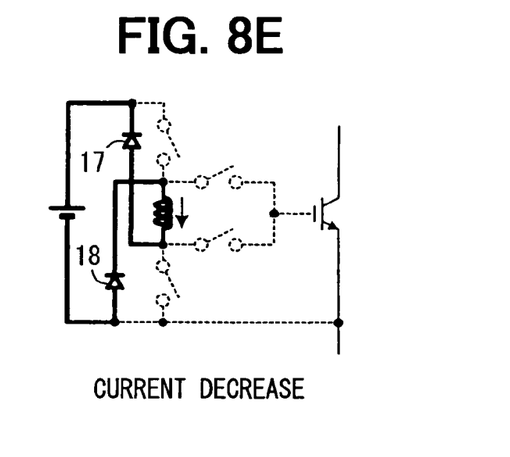

Specifically, the following operation modes may be conceived:

(A) an inflow current gradual increase mode in which as shown in FIG. 8A the first and the fourth switches 13 and 16 are turned on, and the second and the third switches 14 and 15 are turned off, so that the gate current flowing into the gate of the driving target device SW is gradually increased;

(B) an outflow current gradual increase mode in which as shown in FIG. 8B the first and the fourth switches 13 and 16 are turned off, and the second and the third switches 14 and 15 are turned on, so that the gate current flowing out from the gate of the driving target device SW is gradually increased;

(C) a current maintenance mode in which as shown in FIG. 8C the first and the second switches 13 and 14 are turned off, and the third and the fourth switches 15 and 16 are turned on, so that the gate current Ig is temporarily stopped, while the reactor current Ir is made to flow back and is maintained;

(D) a current increase mode in which as shown in FIG. 8D the first and the second switch 13 and 14 are turned on, and the third and the fourth switches 15 and 16 are turned off, so that the gate current Ig is temporarily stopped, while the reactor current Ir is increased; and (E) a decrease mode in which as shown in FIG. 8E all the switches 13 to 16 are turned off, so that the gate current Ig is temporarily stopped, while the reactor current Ir is decreased.

These operation modes can be used in the case where at the time of the turn-on or turn-off operation, active gate driving to more finely control the gate current is realized.

Second Embodiment

Figure 9A:
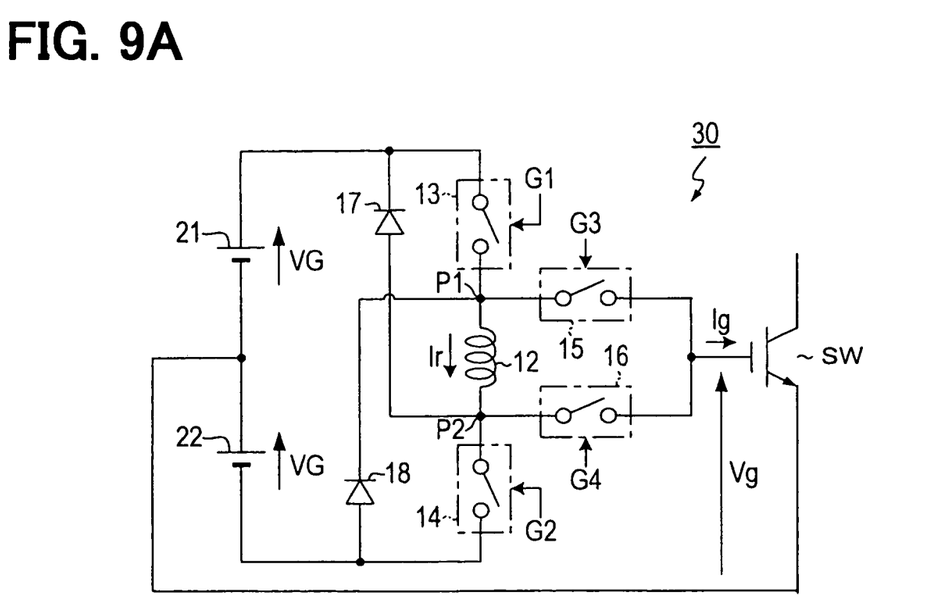
FIGS. 9A and 9B are circuit diagrams of a gate driving circuit, and a gate control part and a detection part in a second embodiment of the present invention.
Figure 9B:
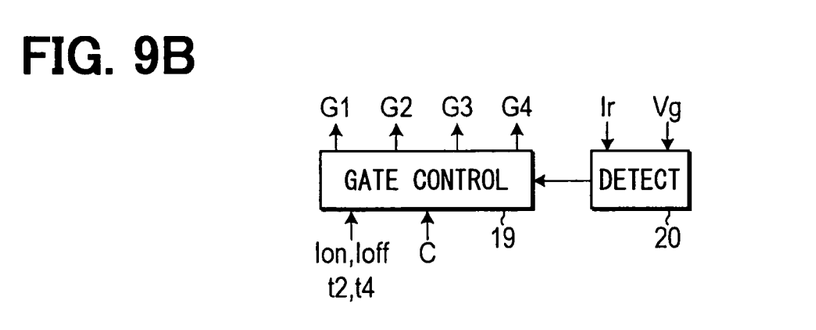
Figure 10A:
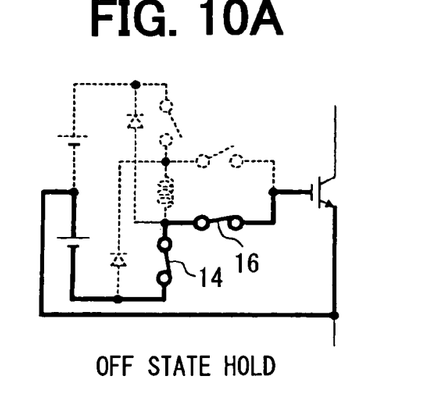
FIGS. 10A to 10E are operation diagrams showing operation modes at the time of a turn-on operation of the gate driving circuit in the second embodiment.
Figure 10B:
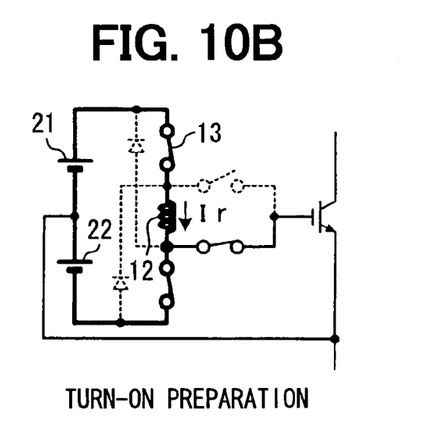
Figure 10C:
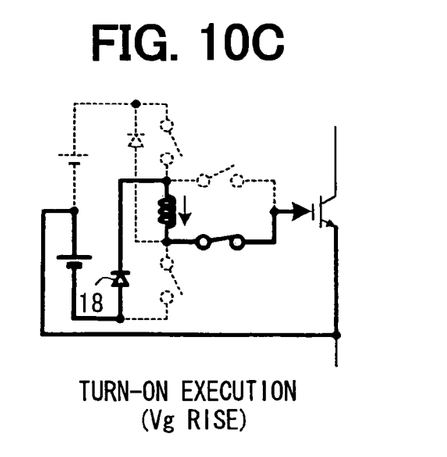
Figure 10D:
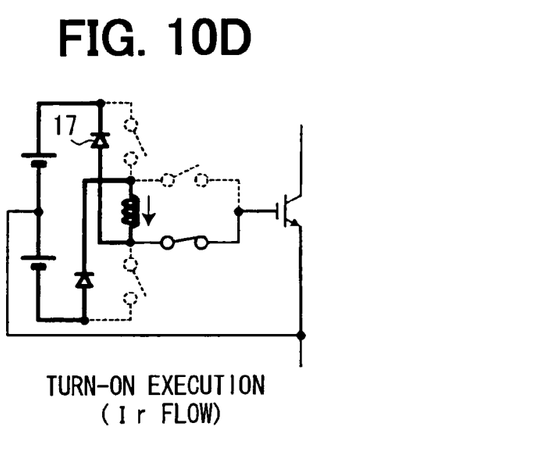
Figure 10E:
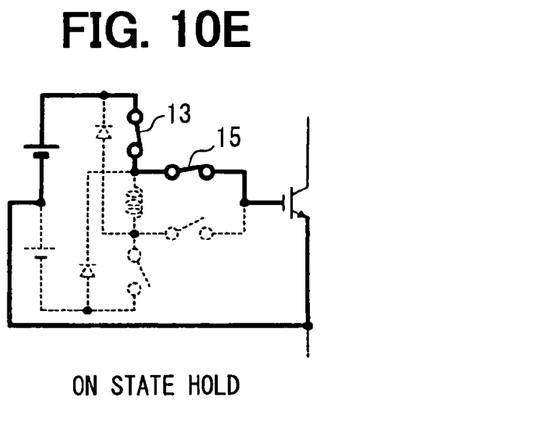
Figure 11A:
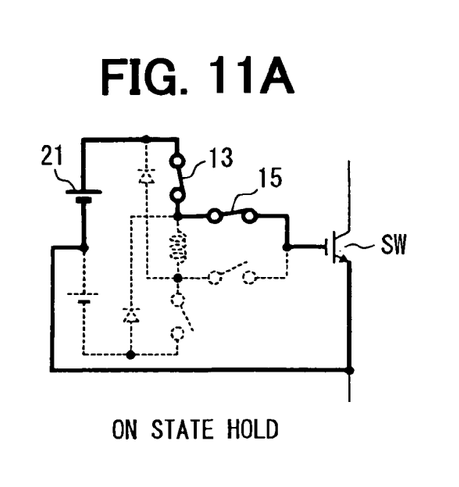
FIGS. 11A to 11E are operation diagrams showing operation modes at the time of a turn-off operation of the gate driving circuit in the second embodiment.
Figure 11B:
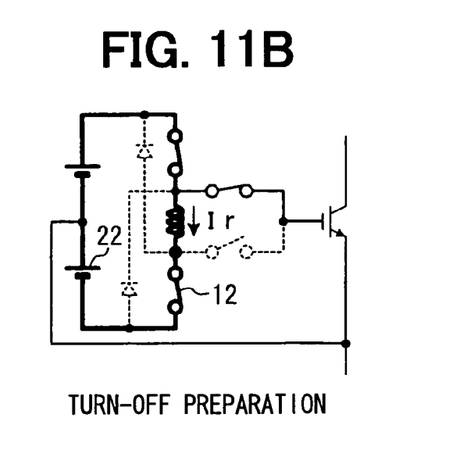
Figure 11C:
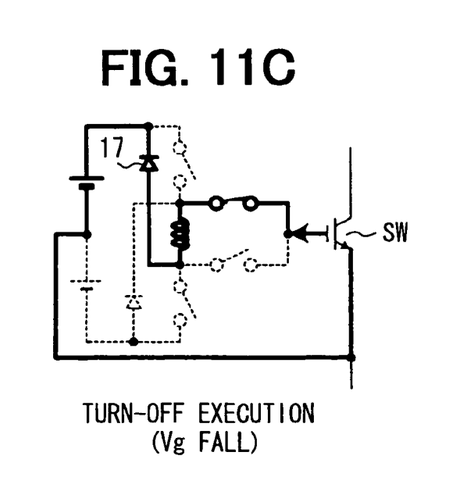
Figure 11D:
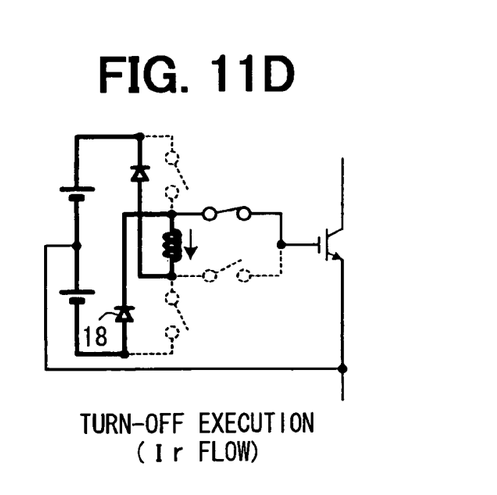
Figure 11E:
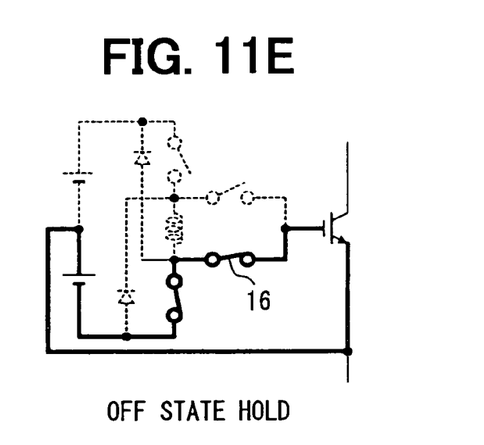
Figure 12A:
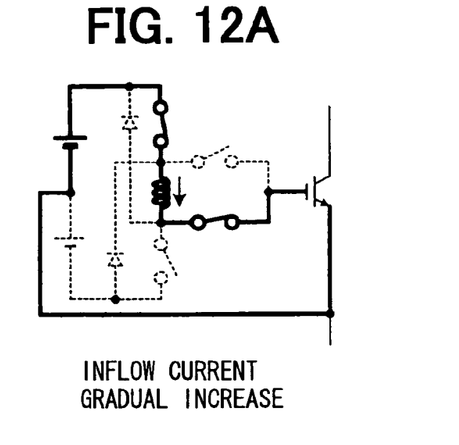
FIGS. 12A to 12E are operation diagrams showing other operation modes of the gate driving circuit in the second embodiment.
Figure 12B:
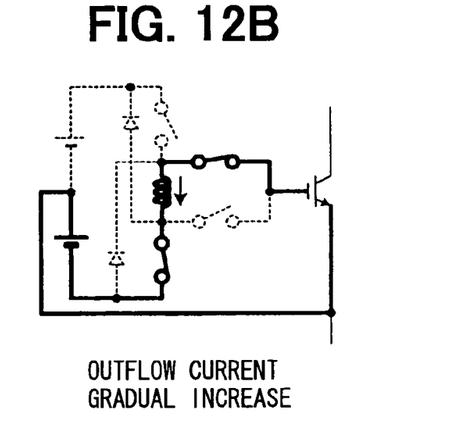
Figure 12C:
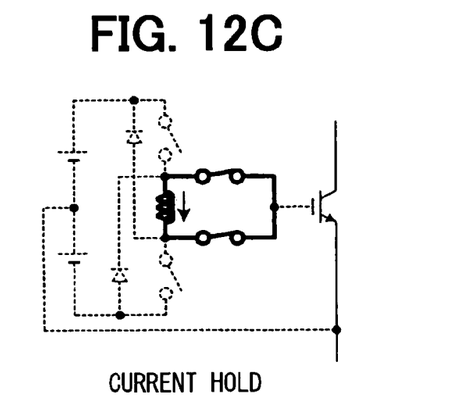
Figure 12D:
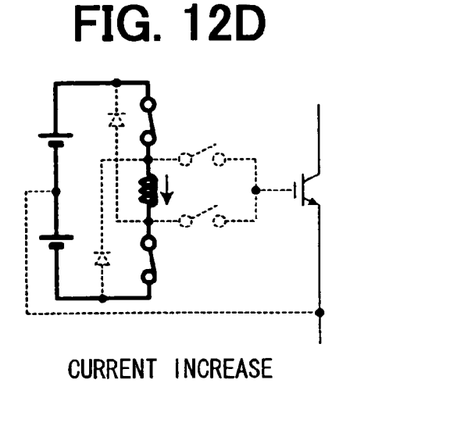
Figure 12E:
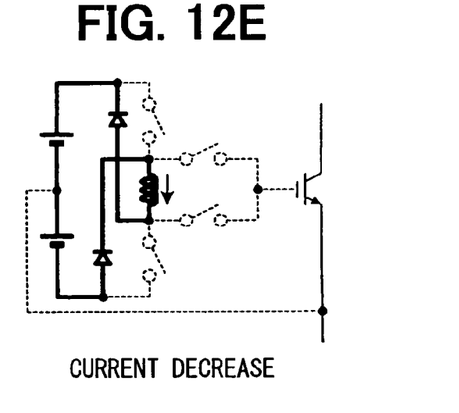

In the second embodiment, only a part of a gate driving circuit is different. As shown in FIG. 9A, a gate driving circuit 30 is similar to that of the first embodiment except that a pair of series-connected DC power sources 21 and 22 are used instead of the single DC current 11, and a connection point (power source intermediate point) of both DC power sources 21 and 22 is connected to the emitter of the driving target device SW and is made to have a reference potential of the gate voltage.

Figure 5B:
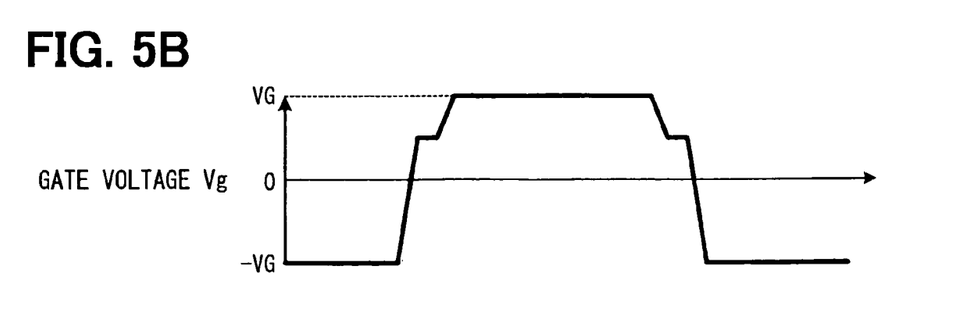

The operation is similar to that of the first embodiment except that as shown in FIG. 5B, when the driving target device SW is turned off, an OFF-voltage applied to the gate is not 0 V but –VG.

In the gate driving circuit 30 constructed as stated above, when the driving target device SW is turned off, the negative voltage –VG is applied, and as compared with the case of the first embodiment, the charging/discharging speed of the gate capacitance is improved, so that the switching of the driving target device SW can be performed at higher speed.

Besides, even if the driving target device SW is a normally-on device, it can be driven.

FIGS. 10A to 10E show states of respective operation modes at the time of execution of a turn-on operation of the gate driving circuit 30 (OFF state hold mode→turn-on preparation mode→turn-on execution mode (gate voltage is rising))→turn-on execution mode (at the time of backflow of gate current)→ON state hold mode). FIGS. 11A to 11E show states of respective operation modes at the time of execution of a turn-off operation (ON state hold mode→turn-off preparation mode→turn-off execution mode (gate voltage is falling)→turn-off execution mode (at the time of backflow of gate current)→OFF state hold mode).

Further, FIGS. 12A to 12E show other operation modes executable in the gate driving circuit 30 (inflow current gradual increase mode, outflow current gradual increase mode, current maintenance mode, current increase mode, and current decrease mode).

Other Embodiments

In the above embodiments, after the switching to the execution mode, the switching to the hold mode is performed at the time point when the execution mode continuation time t2, t4 has passed (S160—YES or S240—YES). However, in the case where it is detected in the detection part 20 that the reactor current Ir is zero, the switching to the hold mode may be performed. In this case, the detection part 20 operates as the current detection unit.

In the above embodiments, it is assumed that there occurs a case where the gate command C is turned off before the execution mode continuation time t2 has passed, or the gate command C is turned on before the execution mode continuation time t4 has passed. However, in the case where such a case does not occur, S170 to S185 and S250 to S265 may be omitted.

Further, in this case, the preparation mode continuation times t1 and t3 corresponding to the initial gate current Ion and Ioff may be set. When the operation mode is switched to the preparation mode (S130, S210), the timer for timing may be started, and instead of S140 and S220, at the time point when the measured time of the timer for timing exceeds the preparation mode continuation time t1, t3, the operation mode maybe switched to the execution mode (S150, S230).

In the above embodiments, the gate voltage Vg is monitored at S180 and S260. However, the detection part 20 may be made to detect the gate current Ig, the gate current Ig may be monitored at S180 and S260. When the gate current becomes zero, the operation mode may be switched from the execution mode to the preparation mode.

In the above embodiments, although the gate control part 19 generates the gate signals G1 to G4 by the processing of the microcomputer, these gate signals G1 to G4 may be generated by hardware.

In the above embodiment, although the IGBT is used as the driving target device SW, another voltage driving type transistor such as an FET may be used.

What is claimed is:

1. A gate driving circuit for a driving target device operable with a DC power source, comprising:
a reactor having a set inductance;
a variable current carrying path which switches a current carrying path among the driving target device, the DC power source and the reactor to perform an operation in one of plural operation modes including at least a hold mode in which a gate of the driving target device is directly connected to a positive electrode or a negative electrode of the DC power source to hold the driving target device in an ON state or an OFF state, a preparation mode in which the ON state or the OFF state of the driving target device held in the hold mode is held and a closed loop for causing a reactor current to flow through the reactor from a positive electrode side terminal to a negative electrode side terminal is formed between the DC power source and the reactor, and an execution mode in which a closed loop for causing a gate current having a magnitude equal to a reactor current to flow in or to flow out is formed between the reactor and parasitic capacitance of the gate of the driving target device, the variable current carrying path including a backflow path for causing the reactor current flowing through the reactor to flow back to the DC power source when a gate voltage of the driving target device deviates from a preset allowable voltage range; and
a drive control part which sets the operation mode of the variable current carrying path to the hold mode and holds the ON state or the OFF state of the driving target device, and further switches the operation mode in sequence of the preparation mode and the execution mode, and realizes turn-on or turn-off of the driving target device.

2. The gate driving circuit according to claim 1, wherein the DC power source and the driving target device are connected so that a potential of one of the positive electrode and the negative electrode of the DC power source becomes a reference potential to a gate potential of the driving target device.

3. The gate driving circuit according to claim 1, wherein the DC power source and the driving target device are connected so that an intermediate potential between the positive electrode and the negative electrode of the DC power source becomes a reference potential to a gate potential of the driving target device.

4. The gate driving circuit according to claim 1, further comprising:
a load detection unit to detect a magnitude of a load driven by the driving target device,
wherein the drive control part sets a magnitude of the reactor current made to flow in the preparation mode in accordance with a detection result in the load detection unit.

5. The gate driving circuit according to claim 1, further comprising:
a current detection unit to detect the reactor current,
wherein the drive control part continues the execution mode until a magnitude of the reactor current detected by the current detection unit becomes zero.

6. The gate driving circuit according to claim 1, wherein the drive control unit causes a continuation time of the execution mode to have a fixed length.

7. The gate driving circuit according to claim 1, wherein the variable current carrying path includes:
a first switch to interrupt a current carrying path from the positive electrode side terminal as one end of the reactor to the positive electrode of the DC power source;
a second switch to interrupt a current carrying path from the negative electrode side terminal as the other end of the reactor to the negative electrode of the DC power source;

a third switch to interrupt a current carrying path from the positive electrode side terminal of the reactor to the gate of the driving target device;

a fourth switch to interrupt a current carrying path from the negative electrode side terminal of the reactor to the gate of the driving target device;

a first diode whose anode is connected to the negative electrode side terminal of the reactor and whose cathode is connected to the positive electrode of the DC power source; and a second diode whose cathode is connected to the positive electrode side terminal of the reactor and whose anode is connected to the negative electrode of the DC power source.

8. The gate driving circuit according to claim 7, wherein:

the drive control part turns on the first and the third switches and turns off the second and the fourth switches, in the hold mode to hold the driving target device in the ON state;

the drive control part turns off the first and the third switches and turns on the second and the fourth switches, in the hold mode to hold the driving target device in the OFF state;

the drive control part turns on both the first and the second switches in the preparation mode, while holding the third and the fourth switches in the hold mode; and the drive control part turns off both the first and the second switches from a state of the preparation mode in the execution mode.

9. The gate driving circuit according to claim 8, wherein the third and the fourth switches are bidirectional switches.

10. The gate driving circuit according to claim 9, wherein the bidirectional switch includes a pair of series-connected transistors having reverse-biased diodes, and the reverse-biased diodes are directed in opposite directions to each other.

* * * * *